US006313413B1

(12) United States Patent
Chen et al.

(10) Patent No.: US 6,313,413 B1
(45) Date of Patent: Nov. 6, 2001

(54) WIRE STRUCTURE OF SUBSTRATE FOR LAYOUT DETECTION

(75) Inventors: Kun-Ching Chen, Tainan; Yire-Zine Lee, Kaohsiung Hsien; Yung-I Yeh; Su Tao, both of Kaohsiung, all of (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 09/414,584

(22) Filed: Oct. 8, 1999

(51) Int. Cl.$^7$ ............................... H05K 1/11; H01R 12/04
(52) U.S. Cl. ........................ 174/262; 174/261; 361/768; 361/777
(58) Field of Search ................................. 174/260, 261, 174/254; 361/767, 768, 771, 777, 779, 783, 749, 751, 750

(56) References Cited

U.S. PATENT DOCUMENTS

| | | | |
|---|---|---|---|
| 4,195,195 | * 3/1980 | de Miranda et al. | 174/68.5 |
| 4,758,459 | * 7/1988 | Mehta | 428/131 |
| 5,572,346 | * 11/1996 | Sakamoto et al. | 359/88 |
| 5,949,657 | * 9/1999 | Karabatsos | 361/803 |
| 6,157,541 | * 12/2000 | Hacke | 361/749 |

\* cited by examiner

Primary Examiner—Jeffrey Gaffin
Assistant Examiner—José H. Alcala
(74) Attorney, Agent, or Firm—Bacon & Thomas

(57) ABSTRACT

The substrate of the present invention mainly includes a plurality of bonding pads, a plurality of ball pads, a plurality of traces, a plurality of holes, a first wire and a second wire. The bonding pads and ball pads are located on a first surface of the substrate and are connected to one another by the traces. The first wire is arranged at the edge of the first surface of the substrate, the second wire is arranged at a slot area of a second surface of the substrate which is adhesively covered by a solder mask and further has two ends connecting to the first wire. The holes connect the first surface to the second surface. The traces are connected the bonding pads and ball pads of the first surface by passing through the corresponding holes and a slot area to the second wire of the second surface to form closed loops. In the slot area, the solder mask adhesively covers the traces. During the slot sawing processes of the slot area, some parts of the traces in the slot area and the second wire are cut to form an opened loop. Then the ends of the traces at the edge of the slot area have little lateral malleability. Thus the adjacent ends of traces cannot be connected to one another; so the substrate of the present invention can use the socket of the test machine to increase efficiency.

10 Claims, 4 Drawing Sheets

WIRE STRUCTURE OF SUBSTRATE FOR LAYOUT DETECTION

BACKGROUND OF THE INVENTION

1. Field of the Invention

The present invention relates generally to a wire structure of Chip on Substrate (COS) for layout detection and more particularly to traces of a ball-side surface connecting ball pads and bonding pads through holes to the wire of a die-side surface.

2. Description of the Related Art

BGA (Ball Grid Array) packages of the electronic and computer industries have been required to support higher lead counts within the same package footprint area. BGA packaging mainly includes a substrate which provides bonding pads for wire bonding and ball pads for ball soldering. The bonding pads and ball pads of the substrate are electroplated on its surface to prevent oxidization so as to increase the bondability and solderability so that a wire electrically connects all of the traces which connect to all of bonding pads and ball pads. In order to electroplate a metal layer on the surface of all of bonding pads and ball pads, all of bonding pads and ball pads are cathodes during the electroplating process. When traces of the substrate need to be checked to determine whether bonding pads connects to ball pads, we cannot use the socket of the test machine to detect the quality of an individual trace because all traces of bonding pads and ball pads are connected to one another by a wire resulting in a closed loop of all traces. Therefore, we must use an Automatic Optical Inspection device to detect quality of the traces of the substrate. This takes a long time to complete, thus substrate detection has the drawback of low efficiency. As shown in FIG. 1, a substrate 100 has a plurality of bonding pads 101 and a plurality of ball pads 102. The bonding pads 101 are located at the edge of a slot 110 of the substrate 100 for wire bonding, and the ball pads 102 are located at the periphery of the substrate 100 for ball soldering. Bonding pads 101 are connected to ball pads 102 to form a closed loop through traces 103 and holes 104. A wire 111 is electrically connected to the extensions of all traces 103 at the edge of the substrate 100. We must use an Automatic Optical Inspection device to detect traces of the substrate 100, because all bonding pads 101 are connected to the corresponding ball pads 102 by the corresponding wires 111 forming a closed loop. This takes a long time to complete so that substrate detection has the drawback of low efficiency.

As shown in FIG. 2, a substrate 200 has a plurality of bonding pads 201 and a plurality of ball pads 202. The bonding pads 201 are located at the edge of a slot area 210 of the substrate 200 for wire bonding, and the ball pads 202 are located at the periphery of the substrate 200 for ball soldering. Bonding pads 201 are connected to ball pads 202 to form closed loops through traces 203 and holes 204. A first wire 211 is provided at the edge of the substrate 200; a second sire 212 is provided in the slot area 210 and is electrically connected to the first wire 211 at the two ends of the slot area 210. The extensions of the traces 203 in the slot area 210 are electrically connected to the second wire 212 such that the traces 203, the first wire 211 and the second wire 212 form a closed loop. All bonding pads 201 are connected to all ball pads 202 through the first wire 211 and the second wire 212 because the traces 203 are extended to the slot area 210 for connection to the second wire 212. Therefore, slot sawing is performed at the slot area 210 to form an opened loop between the traces 203 and the second wire 212 such that the bonding pads 201 are connected to the corresponding ball pads 202 by the traces 203. The tensions of the traces 203 from the bonding pads 201 in the slot area 210 are too close one another and are not covered by solder mask such that the extensions are exposed on the substrate 200. Then when slot sawing is performed at the slot area 210, the ends of the extensions at the edge of the slot area 210 have lateral malleability and the substrate 200 is thereby broken down so that the adjacent ends are connected one another.

The present invention intends to provide a wire structure of substrate for layout detection in which traces of the ball-side surface of the substrate connect to ball pads and a wire of the chip-side surface of the substrate through holes. The wire is located at a slot area which is covered by solder mask to mount the ends of the traces to prevent a short of the traces after slot sawing. The present invention provides a wire connection to traces covered with solder mask in such a way as to mitigate and overcome the above problem.

SUMMARY OF THE INVENTION

The primary objective of this invention is to provide a wire structure of substrate for layout detection in which traces of the ball-side surface of the substrate connect to ball pads and a wire of the chip-side surface of the substrate through holes. The wire is located at a slot area on which the covering solder mask is used to mount the ends of the traces. The present invention thereby increases adhesion of the traces to the substrate to prevent the traces peeling off the substrate and being too close to the other traces after slot sawing such that the substrate of the present invention can use the socket of the test machine to increase efficiency.

The present invention is a substrate in accordance with an embodiment; the substrate mainly includes a plurality of bonding pads, a plurality of ball pads, a plurality of traces, a plurality of holes, a first wire and a second wire. The bonding pads and ball pads are located on a first surface of the surface and are connected to one another by the traces. The first wire is arranged at the edge of the first surface of the substrate; the second wire is arranged at a slot area of a second surface of the substrate which is adhesively covered by a solder mask and further has two ends connecting to the first wire. The holes connect the first surface to the second surface. The traces connect the bonding pads and ball pads of the first surface by passing through the corresponding holes and a slot area to the second wire of the second surface to form closed loops. In the slot area, the solder mask adhesively covers the traces. During the slot sawing process on the slot area, some parts of the traces of the slot area and the second wire are cut to form opened loop. Then the ends of the traces at the edge of the slot area have little lateral malleability the adjacent ends of traces cannot be connected to one another such that the substrate of the present invention can use the socket of the test machine to increase efficiency.

Other objectives, advantages and novel features of the invention will become more apparent from the following detailed description and the accompanying drawings.

BRIEF DESCRIPTION OF THE DRAWINGS

The present invention will now be described in detail with reference to the accompanying drawings herein.

DETAILED DESCRIPTION OF THE INVENTION

Figure 1:
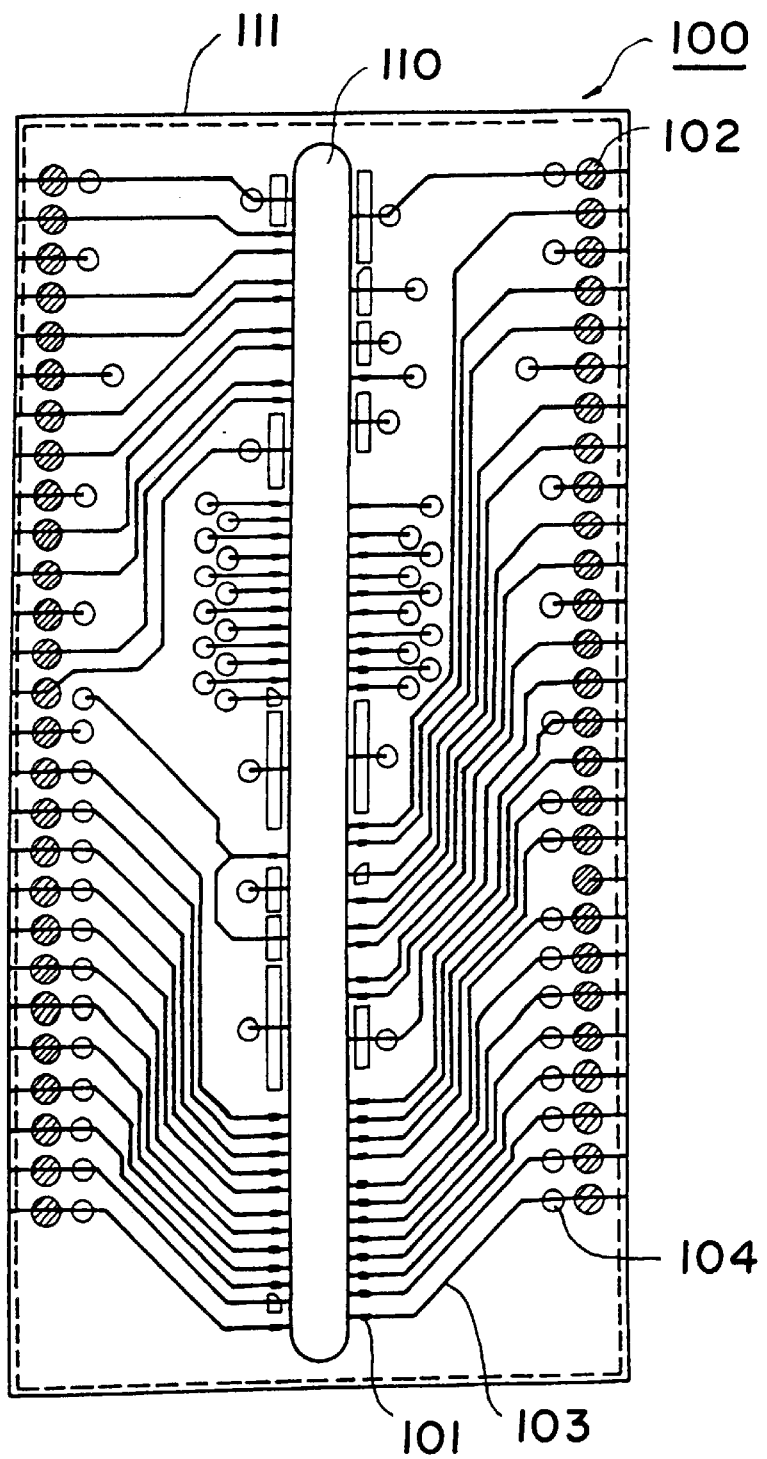
FIG. 1 is a schematic view of traces and wire of a substrate in accordance with convention.
Figure 2:
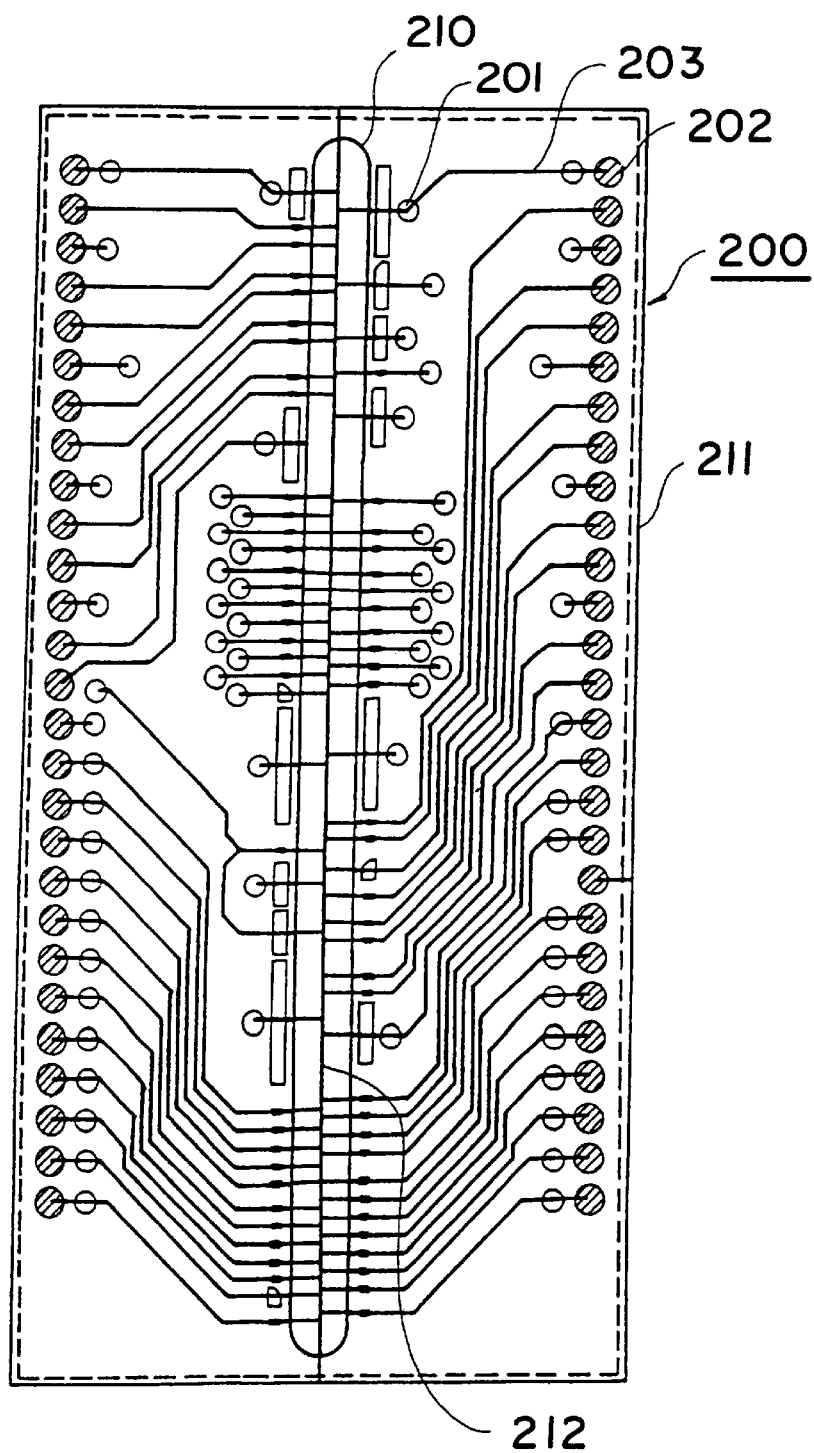
FIG. 2 is a schematic view of traces and wire of another substrate in accordance with convention.

The substrate of the present invention mainly includes a first surface with bonding pads and ball pads which are electrically connected to a wire, in a slot area, of a second surface by traces through the corresponding holes. In the slot area, the solder mask adhesively covers the traces. In the slot area, the solder mask adhesively covers the traces to avoid peeling during slot sawing. After the surfaces of bonding pads and ball pads are electroplated, the wire connecting to traces in the slot area is cut by slot sawing so as to electrically open the traces to one another. Thus the bonding pads are electrically connected to only the corresponding ball pads by the traces such that the present invention can use the socket of the test machine to detect the quality of an individual trace. Some traces have no corresponding holes for passing through from the first surface to the second surface and are connected to a wire which is arranged at the periphery by conventional method, as shown in FIG. 1. These traces are extended for connection to the wire of the substrate and thus the present invention can use an Automatic Optical Inspection device to detect the quality of some of traces. As shown in FIG. 2, these traces can extend to a slot area and are connected to the wire, and then there is enough space between any two of these traces in the slot area. Then during slot sawing to form an elongated slot, the end of the traces cannot connect to one another to form a closed loop even if the ends of the extensions at the edge of the slot area have lateral malleability, thus the bonding pads are electrically connected just to the corresponding ball pads by the corresponding traces.

Figure 3:
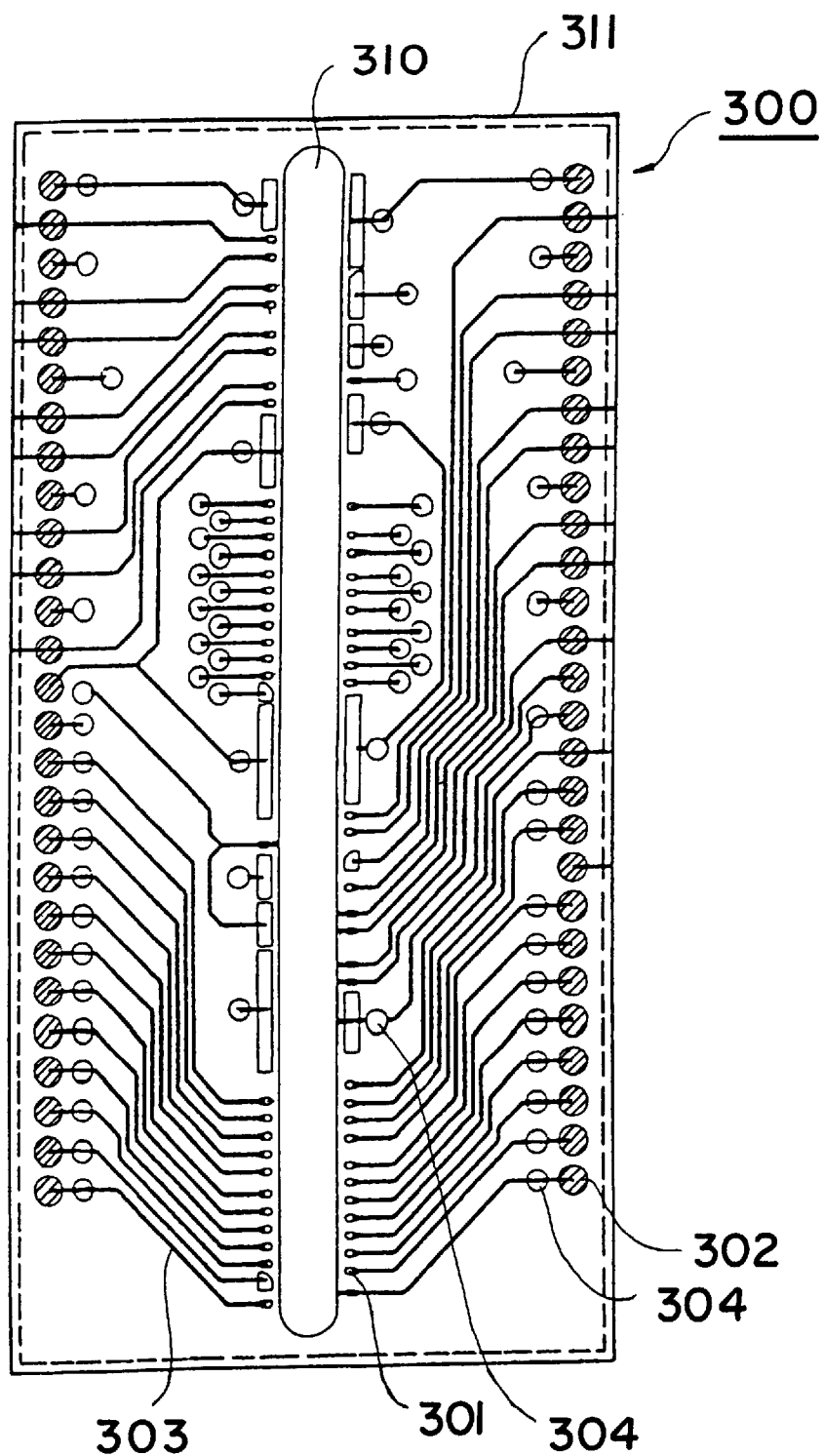
FIG. 3 is a schematic view of traces and wire of a first surface of a substrate in accordance with the present invention.

Referring to FIG. 3, a substrate 300 of the present invention includes a first surface on which is mainly comprise a plurality of bonding pads 301, a plurality of ball pads 302, a plurality of traces 303, a plurality of holes 304 and a first wire 311. The first wire 311 is arranged to surround the bonding pads 301, the ball pads 302, the traces 303 and the holes 304. The bonding pads 301 are electrically connected to the corresponding ball pads 302 by the corresponding traces 303, and the first wire 311 is arranged on the edge of the first surface of the substrate 300. The traces 303 are laid out in the corresponding holes 304 which connect the first surface and the second surface of the substrate 300 thereby the traces 303 are conducted from the first surface to the second surface.

Figure 4:
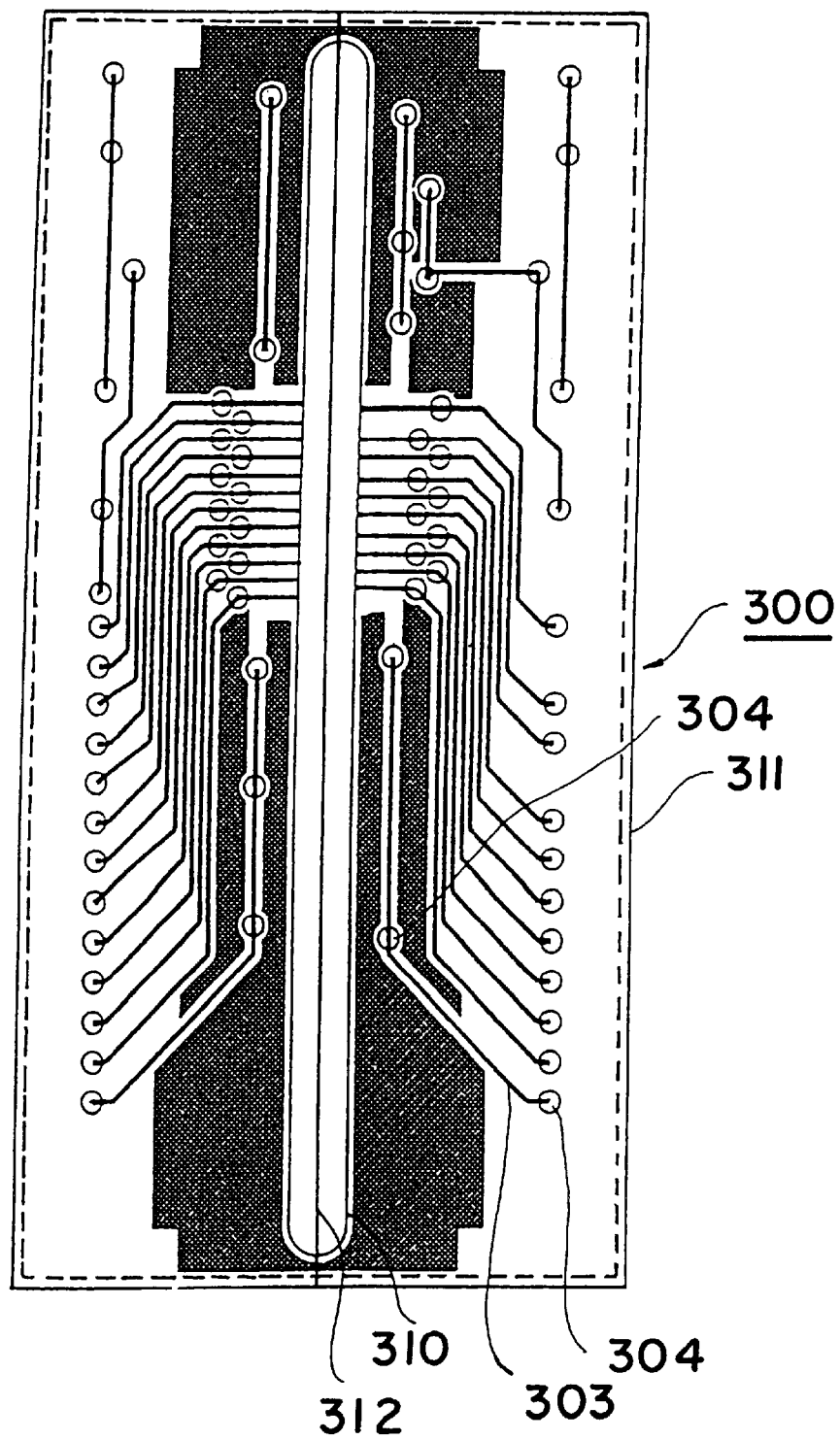
FIG. 4 is a schematic view of traces and wire of a second surface of a substrate in accordance with the present invention.

Referring to FIG. 4, the substrate 300 of the present invention further includes a second surface on which is mainly comprise a plurality of traces 303, a plurality of holes 304 and a second wire 312. The second wire 312 is arranged in the slot area 310 of the second surface which is adhesively covered with a solder mask. The traces 303 are laid out in the corresponding holes 304 which connect the first surface and the second surface of the substrate 300; thereby one end of the traces 303 is conducted from the second surface to the first surface, as shown in FIG. 1. The other end of the traces 303 is electrically connected to the second wire 312 which is arranged in the slot area 310. Thus the second wire 312 is connected to the bonding pads 301 and the ball pads 302 of the first surface by the corresponding traces 303 and the corresponding holes 304. After the substrate 300 is electroplated, a solder mask covers the traces 303 of the slot area 310. Thus when the substrate 300 is processed for slot sawing, opened loops are formed between the traces 303 and the second wire 312. Because the solder mask covers the traces 303 in the slot area 310, the ends of the traces 303 at the edge of the slot area 310 have no lateral malleability to prevent the adjacent ends from being connected to one another to form closed loops for layout detection after slot sawing. After the substrate 300 is processed for slot sawing, the traces 303 are conducted from the first surface to the second surface and electrically connect only the bonding pads 301 to the corresponding ball pads 302. Therefore, the substrate 300 of the present invention can use a conventional testing machine.

Although the invention has been described in detail with reference to its present preferred embodiment, it will be understood by one of ordinary skill in the art that various modifications can be made without departing from the spirit and the scope of the invention, as set forth in the appended claims.

What is claimed is:

1. A wire structure of substrate for layout detection comprising:

a substrate with a first surface and a second surface, a plurality of bonding pads, a plurality of ball pads, a plurality of traces and a plurality of holes are provided on the first surface, the traces electrically connect the bonding pads to the corresponding ball pads, the traces are arranged in the holes and connect the first surface and the second surface, the traces are arranged to pass through the corresponding holes and are conducted from the first surface to the second surface, the second surface of the substrate has a slot area in which is provided a wire for connecting to ends of the traces, thereby the wire is electrically connected to the bonding pads and the ball pads to form closed loops, wherein after the substrate is sawed to form a slot, the traces of the first surface electrically connect the bonding pads to the corresponding ball pads.

2. The wire structure of substrate for layout detection, as defined in claim 1, wherein a solder mask covers the slot area for mounting the traces.

3. The wire structure of substrate for layout detection, as defined in claim 1, wherein the second surface is provided for a chip adhesively attaching to the slot.

4. The wire structure of substrate for layout detection, as defined in claim 1, wherein the second surface is provided for a chip adhesively attaching to the slot, and the chip is wire bonded to form the connection of the chip and the substrate.

5. The wire structure of substrate for layout detection, as defined in claim 1, wherein the slot is arranged in the center of the substrate.

6. A wire structure of substrate for layout detection comprising:

a substrate with a first surface and a second surface, a plurality of bonding pads, a plurality of ball pads, a plurality of traces and a plurality of holes are provided on the first surface, all of the traces electrically connect the bonding pads to the corresponding ball pads, the traces are arranged in the holes and connect the first surface and the second surface, some of the traces are arranged to pass through the corresponding holes and are conducted from the first surface to the second surface, the second surface of the substrate has a slot area in which is provided a wire for connecting to ends of the traces, thereby the wire is electrically connected to the bonding pads and the ball pads to form closed loops, wherein after the substrate is sawed to form a slot, the traces of the first surface are electrically connect the bonding pads to the corresponding ball pads.

7. The wire structure of substrate for layout detection, as defined in claim 6, wherein a solder mask cover the slot area for mounting the traces.

8. The wire structure of substrate for layout detection, as defined in claim 6, wherein the second surface is provided for a chip to adhesively attach to the slot.

9. The wire structure of substrate for layout detection, as defined in claim 6, wherein the second surface is provided for a chip to adhesively attach to the slot, and the chip is wire bonded to form the connection of the chip and the substrate.

10. The wire structure of substrate for layout detection, as defined in claim 6, wherein the slot is arranged in the center of the substrate.

* * * * *